United States Patent

Hayashida et al.

[11] Patent Number: 5,290,361
[45] Date of Patent: Mar. 1, 1994

[54] SURFACE TREATING CLEANING METHOD

[75] Inventors: Ichiro Hayashida; Masahiko Kakizawa; Kenichi Umekita; Hiroyoshi Nawa, all of Kawagoe; Hisashi Muraoka, Yokohama, all of Japan

[73] Assignees: Wako Pure Chemical Industries, Ltd., Osaka; Purex Co., Ltd., Yokohama, both of Japan

[21] Appl. No.: 824,955

[22] Filed: Jan. 23, 1992

[30] Foreign Application Priority Data

Jan. 24, 1991 [JP] Japan .................................. 3-024094

[51] Int. Cl.$^5$ ........................... B08B 3/00; B08B 3/05; C23G 1/00
[52] U.S. Cl. .......................................... 134/2; 134/26
[58] Field of Search ........................ 134/2, 26

[56] References Cited

U.S. PATENT DOCUMENTS

| | | | |
|---|---|---|---|
| 4,059,678 | 11/1977 | Winkley | 423/273 |
| 4,239,661 | 12/1980 | Muraoka et al. | 134/42 |
| 4,304,762 | 12/1981 | Leigh | 423/273 |
| 4,339,340 | 7/1982 | Murraoka et al. | 134/34 |
| 4,362,706 | 12/1982 | Willard | 423/273 |
| 4,534,945 | 8/1985 | Hopkins et al. | 423/273 |

FOREIGN PATENT DOCUMENTS

| | | |
|---|---|---|
| 0097305 | 1/1984 | European Pat. Off. . |
| 0276774 | 8/1988 | European Pat. Off. . |
| 2624500A1 | 6/1989 | France . |
| 53-20377 | of 1975 | Japan . |
| 50-147284 | 11/1975 | Japan . |
| 55-45484 | of 1980 | Japan . |
| 59-45601 | of 1984 | Japan . |
| 60-239305 | of 1985 | Japan . |
| 62-57566 | of 1987 | Japan . |
| 62-57567 | of 1987 | Japan . |
| 1057089 | 2/1967 | United Kingdom . |
| 1119221 | 10/1968 | United Kingdom . |

OTHER PUBLICATIONS

Chemical Abstract 70 (1969), 107901s.
Chemical Abstract 84 (1976) 188550r.
Database WPI, week 7808, JP-A-50 147 284, Nov. 26, 1975.
Database WPI, week 7630, JP-A-50 022 721, Mar. 11, 1975.

Primary Examiner—R. Bruce Breneman
Assistant Examiner—Zeinab El-Arini
Attorney, Agent, or Firm—Armstrong, Westerman, Hattori, McLeland & Naughton

[57] ABSTRACT

A combination of a first surface treating solution comprising an inorganic or organic alkali such as ammonia or a quaternary ammonium hydroxide, hydrogen peroxide, water and a second surface treating solution of ultra-pure water, at least one of the first and second surface treating solutions containing as a complexing agent a compound having one or more phosphonic acid groups in the molecule and showing chelating ability, or an oxidized form thereof, or polyphosphoric acid or a salt thereof, is effective for making semiconductor surfaces free from harmful metallic impurities such as Fe, Al, Zn, etc.

8 Claims, 2 Drawing Sheets

FIG. 1

SURFACE TREATING CLEANING METHOD

BACKGROUND OF THE INVENTION

This invention relates to a process for treating (or cleaning) surfaces of semiconductors, LCD, etc. with special treating solutions containing a special complexing agent and the treating solutions per se.

Semiconductor devices such as LSI, IC, diodes, commutators, etc. are almost silicon devices which are produced by subjecting a silicon wafer to processing steps such as vapor phase growth, oxide film formation, impurity diffusion, vapor phase deposition of electrode metal, etc. Since contamination with impurities remarkably influences on electrical properties of semiconductors, it is necessary to clean silicon wafer surfaces sufficiently for removing contamination prior to above-mentioned processing steps.

Various industrial cleaning methods which are different as for treating chemicals, treating temperature, etc. have been employed. A series of treatments called "RCA cleaning method" (RCA Review pp. 187–206, June, 1970, etc.) appeared in the mid-1970s and have been used widely since that time and become a major method for wet cleaning. The RCA cleaning method is a combination of (i) SC-1 treatment using ammonia, hydrogen peroxide and water and effective for removing contamination with organic materials and a part of metals such as Cu, Ag, etc., particularly effective for removing contamination with fine particulates, (ii) a dilute HF treatment for removing natural silicon oxide films, and (iii) SC-2 treatment using hydrochloric acid, hydrogen peroxide and water, and remarkably effective for removing metal contamination.

The sequence of RCA cleaning method generally used is SC-1 treatment→dilute HF treatment→SC-2 treatment. But the dilute HF treatment easily gives fine particulates contamination on the surface of silicon wafer and the SC-2 treatment is poor for removing fine particulates. With recent ultra-high integration of LSI, device patterns are rapidly miniaturized and the size of fine particulates which damage devices is also remarkably miniaturized. The smaller the size of fine particulates becomes, the stronger the adhesive strength for wafers becomes. Thus, the removal of fine particulates becomes more difficult, resulting in making the production yield strongly depending on the removal ability of fine particulates contamination at the time of cleaning. In order to remove the particulates most effectively, it was tried to conduct the SC-1 treatment at the last step of cleaning sequence. But in case a wafer has been subjected to such a cleaning sequence, the surface of wafer was contaminated with metallic impurities and there arised problems in electrical properties such as deterioration in oxide breakdown voltage and recombination lifetime, etc.

Metallic elements detected on the surface of wafer after the SC-1 treatment are Fe, Al, Ca, Mg, Zn, etc. At first these contaminating metals are derived from the production apparatus for the processing step before the cleaning step or derived from circumstances. They consist of the elements which are not removed due to insufficient cleaning ability of SC-1, and the elements adsorbed on the wafer from the treating solution including these metal elements.

Metallic impurities difficult to be removed are easily adsorbed on the surface of wafers in general. Among various metallic impurities, Fe and Al have such a tendency remarkably as compared with other above-mentioned elements. In a mass production factory, as a high-productivity cleaning apparatus, there is commonly used a Tact method wherein wafers entered in a carrier are passed to cleaning baths one after another. Thus, contaminating elements released in the liquid of a SC-1 treating bath by cleaning are gradually accumulated to provide an undesirable contamination by adsorption on succeeding wafers. Further, when ammonia and hydrogen peroxide with extremely high purity are not used, there takes place contamination by adsorption of impurities in the cleaning chemicals. In the production and storing of hydrogen peroxide, since metals such as Al are used, it is particularly necessary to highly purify the hydrogen peroxide used for semiconductor cleaning. Further, these highly pure chemicals are easily contaminated in vessels for transport or in feeding system to cleaning baths, that it is not easy to maintain the purity of these chemicals at very high level in cleaning baths.

Usually, after the SC-1 treatment, the surface of wafer is contaminated with about $10^{11}$ to $10^{12}$ atoms/cm$^2$ of Fe, about $10^{11}$ to $10^{13}$ atoms/cm$^2$ of Al, and about $10^{10}$ to $10^{11}$ atoms/cm$^2$ in the cases of Ca, Mg, and Zn. Contamination with these metals in such concentrations except for Fe gives negligible influence of electrical properties such as oxide breakdown characteristics and recombination lifetime properties. Thus, the element which damages electrical properties as for the SC-1 treatment is Fe. On the surface of the p-type wafer in which influences of Fe on the lifetime is remarkable, negligible concentration of Fe for lowering the lifetime is $10^{10}$ atoms/cm$^2$ or less. Further, as to a time dependent dielectric breakdown test (TDDB properties) of oxide films, it is necessary to make the concentration of Fe as low as about $10^{10}$ atoms/cm$^2$ in order to attain an intrinsic breakdown time of non-contaminated wafer. It was extremely difficult to obtain such a degree of cleanness only by the SC-1 treatment.

Another cleaning method similar to the SC-1 treatment is a method of using an organic alkali and hydrogen peroxide. For example, there are disclosed tetramethylammonium hydroxide (TMAH) and hydrogen peroxide (Japanese Patent Unexamined Publication No. 50-147284), trialkyl(hydroxyalkyl)ammonium hydroxide and hydrogen peroxide (Japanese Patent Examined Publication No. 53-43012), etc. These methods are excellent in fine particulates removing ability which is characteristic of the treatment with alkali and hydrogen peroxide like the SC-1 treatment, but great in adsorption of Fe, Al, etc. from the treating solution, resulting in making cleaning ability for wafers contaminated with Fe, Al, etc. insufficient. A method of inactivating metallic impurities as to a material to be cleaned by catching them as stable water-soluble complex is a conventional method for formulating usual cleaning agents. For example, addition of a complexing agent to TMAH and hydrogen peroxide is disclosed in Japanese Patent Unexamined Publication No. 50-158281, and addition of a complexing agent to trialkyl(hydroxyalkyl)ammonium hydroxide and hydrogen peroxide is disclosed in Japanese Patent Examined Publication No. 53-20377 (U.S. Pat. Nos. 4,239,661 and 4,339,340). In each case, the added amount of the complexing agents is in need of 0.01% by weight or more. Addition of a cyano compound such as ammonium cyanide, hydrogen cyanide is dangerous. When an organic compound such as ethylenediamine tetraacetic acid (EDTA), triethanolamine, etc. is added in an amount of 0.01% by weight or more as described in them, harmful carbon contamination takes place on silicon surface to cause problems in electrical properties. Further, when silicon surface is contaminated with Al, it is known that oxidation rate during thermal oxidation is influenced. This is not preferable from the viewpoint of precise control of the process.

As mentioned above, no effective methods have been found to solve insufficiency in cleaning efficiency for harmful metallic impurities such as Fe, Al, etc. in the "alkali and hydrogen peroxide" cleaning which is very effective for fine particulates contamination.

SUMMARY OF THE INVENTION

It is an object of the present invention to provide semiconductor surface treating solutions preventing metallic contamination caused by adsorption from a treating solution, having a high cleaning efficiency and overcoming the problems of known alkali surface treating agents mentioned above. It is another object of the present invention to provide a process for cleaning surfaces of semiconductors using said surface treating solutions.

The present invention provides a process for treating semiconductor surfaces, which comprises a step of treating surfaces of semiconductors with a surface treating solution comprising an inorganic or organic alkali, hydrogen peroxide and water as major components, and a step of treating (or rinsing) the resulting surfaces with ultra-pure water, at least one of the surface treating solution and the ultra-pure water containing as a complexing agent a compound having one or more phosphoric acid groups or a salt thereof in the molecule and showing chelating ability or an oxidized form thereof, or a polyphosphoric acid or a salt thereof.

The present invention also provides a combination of surface treating solutions comprising a first surface treating solution comprising an inorganic or organic alkali, hydrogen peroxide and water as major-components, and a second surface treating solution of ultra-pure water, at least one of the first and second surface treating solutions containing as a complexing agent a compound having one or more phosphoric acid groups or a salt thereof in the molecule and showing chelating ability or an oxidized form thereof, or a polyphosphoric acid or a salt thereof.

The present invention further provides a surface treating solution for semiconductors comprising an inorganic or organic alkali, hydrogen peroxide, water and as a complexing agent a compound having one or more phosphoric acid groups or a salt thereof in the molecule and showing chelating ability or an oxidized form thereof, or a polyphosphoric acid or a salt thereof.

The present invention still further provides an alkali aqueous solution for forming a semiconductor surface treating solution comprising an inorganic or organic alkali and as a complexing agent a compound having one or more phosphoric acid groups or a salt thereof in the molecule and showing chelating ability or an oxidized form thereof, or a polyphosphoric acid or a salt thereof.

The present invention also provides a hydrogen peroxide solution for forming a semiconductor surface treating solution obtained by purification by distillation and removal treatment of metal impurities, followed by addition of a compound having one or more phosphoric acid groups or a salt thereof in the molecule and showing chelating ability or an oxidized form thereof, or a polyphosphoric acid or a salt thereof as a complexing agent.

DESCRIPTION OF THE PREFERRED EMBODIMENTS

The semiconductor surface treating solution of the present invention is characterized by containing a special complexing agent, i.e. a compound having one or more phosphoric acid groups or a salt thereof in the molecule and showing chelating ability or an oxidized form thereof, or polyphosphoric acid or a salt thereof. In the production of semiconductors, integrated LCD, etc., when such a semiconductor surface treating solution is used for cleaning to remove organic materials, fine particulates and contamination with metals on the surface of silicon, germanium, etc., the surface of compound semiconductors such as Ga-As, Ga-P, etc., the surface of films contacting with semiconductors, at least one surface of glass substrates, the effective surface cleaning to improve the yield of final products can be attained.

Lowering of electrical properties by the prior art "alkali and hydrogen peroxide" cleaning is caused mainly by Fe. The contamination by adsorption and insufficiency in cleaning ability in such a case can be removed sufficiently by the present invention. As shown in Comparative Example 1 below, in order to make the concentration of Fe on a silicon wafer surface $10^{10}$ atoms/$cm^2$ or less which concentration is necessary for maintaining the electrical properties after SC-1 cleaning, it is necessary to maintain the Fe concentration in the SC-1 treating solution at 0.01 ppb or less. In the cleaning equipments of common semiconductor factories the wafers pass through the cleaning solution in the bath one after another and the contaminants accumulate in the solution. In practical cases, it is usual that the concentration of Fe on the silicon wafer surface after the SC-1 treatment is $10^{11}$ to $10^{12}$ atoms/$cm^2$ as mentioned above. From FIG. 1, the practical concentration of Fe in the SC-1 cleaning bath can be guessed as about 0.1 to 1 ppb. To such a SC-1 treating solution containing 1 ppb of Fe, even if a complexing agent such as triethanolamine is added according to above-mentioned patent [JP-A 53-20377 (U.S. Pat. Nos. 4,239,661 and 4,339,340)], the Fe adsorbed amount of $10^{11}$ atoms/$cm^2$ can only be attained at the concentration of about 1% by weight. Even in the case of a typical chelating agent such as EDTA, about $10^{10}$ atoms/$cm^2$ of the Fe adsorbed amount can be obtained at the concentration of $10^{-2}$% by weight or more.

According to the experience, when organic materials difficult to be decomposed by heat and change to volatile substances are contained in the "alkali and hydrogen peroxide" treating agent in an amount of more than $10^{-4}$% by weight in terms of carbon concentration, the yield of devices is influenced. Thus, various known chelating agents in an amount of $10^{-4}\%$ by weight were added to a SC-1 cleaning solution containing 1 ppb of Fe to compare adsorbed amounts of Fe on silicon wafer surfaces. In the case of using EDTA, 1,2-cyclohexanediaminetetraacetic acid (CyDTA), triethylenetetraminehexaacetic acid (TTHA), and nitrylotriacetic acid (NTA), these having almost the same high complex-formation constant for Fe, the adsorbed amounts were reduced to only about ½ to ⅓ of the case of adding no chelating agent.

In contrast, according to the present invention, more effective results can be obtained by adding less amount of the special complexing agent. The present inventors considered that the adsorption of metal is caused by hydrogen bond interacting between the OH groups coordinated to the metal ion and OH groups and H groups present on the silicon wafer surface, and the contamination caused by adsorption can be reduced by including a complexing agent which inhibits the coordination bond of OH groups for metal ion in a semiconductor surface treating solution (a first surface treating solution) or ultra-pure water for rinsing (a second surface treating solution). Thus, the present invention has been accomplished.

The complex formation reaction means a competitive reaction of metal ions and H groups against the complexing agent in the acidic region, and a competitive reaction of the complexing agent and OH groups against metal ions in the alkaline region. That is, if the reaction of complexing agent for metal ions (complex formation reaction) is faster than the reaction of OH groups for metal ions (hydroxide formation reaction), and the complex formed by the reaction is stable and water-soluble, the complexing agent can inhibit the hydroxide formation of metal ions present in the alkaline solution. Further, since the complexing agent having a strong complex formation ability can also dissolve the hydroxide, it can be considered that not only coordination of OH groups against the metal can be inhibited by applying the complex formation reaction, but also the adsorbed metallic impurities as hydroxide can be dissolved.

As the strong complexing agent for inhibiting coordination of the OH group against metal ions, a compound having one or more phosphonic acid groups or a salt thereof in the molecule, or an oxidized form thereof, and polyphosphoric acid or a salt thereof are usable. The complexing agents used in the present invention have a chelate formation constant for metal ions such as Fe, Al, Zn, etc. ions sufficiently large for inhibiting coordination of OH groups. Further, the complex formation reaction is easy and rapid, and the complex formed is stable and water-soluble.

Examples of the compound having one or more phosphonic acid groups or a salt thereof in the molecule and showing chelating ability (complexing agent) include methyl diphosphonic acid, aminotris(methylene phosphonic acid), ethylidene diphosphonic acid, 1-hydroxyethylidene-1,1-diphosphonic acid, 1-hydroxypropylidene-1,1-diphosphonic acid, ethyl aminobis(methylene phosphonic acid), dodecyl aminobis(methylene phosphonic acid), nitrylotris(methylene phosphonic acid), ethylenediaminebis(methylene phosphonic acid), ethylenediaminetetrakis(methylene phosphonic acid), hexenediaminetetrakis(methylene phosphonic acid), diethylenetriaminepenta(methylene phosphonic acid), and ammonium salts of these compounds, alkali metal salts (K salts, Li salts, etc. and not including Na salts) of these compounds, etc.

Oxidized forms of these complexing agents include N-oxide forms obtained by oxidizing these complexing agents having an N atom in the molecule. These oxidized forms have a complex formation ability and show remarkable effects for inhibiting adsorption of metal ions on the silicon wafer surface as the phosphonic acid groups.

Examples of the polyphosphoric acids and salts thereof include metaphosphoric acid, tetrametaphosphoric acid, hexametaphosphoric acid, pyrophosphoric acid, tripolyphosphoric acid, ammonium salts of these phosphoric acids, alkali metal salts (K salts, Li salts, etc. and not including Na salts) of these phosphoric acids, etc.

These complexing agents of the present invention can previously be added to at least one component selected from an inorganic or organic alkali, hydrogen peroxide and water, before they are mixed, or alternatively an organic or inorganic alkali, hydrogen peroxide and water are previously mixed and then the complexing agent of the present invention can be added to the mixture.

For example, when ethylidene diphosphonic acid (EDP) is added to the SC-1 cleaning solution containing 1 ppb of Fe in an amount of making the concentration $10^{-4}\%$ by weight, the adsorption of Fe becomes $10^{10}$ atoms/cm$^2$ or less. This clearly shows the difference in adsorbed amount compared with above mentioned known chelating agents. The same effect can be obtained when other complexing agents of the present invention are used. Further, the cleaning efficiency can also be improved by using the complexing agent of the present invention. For example, the remaining rate after cleaning a Fe contaminated silicon wafer becomes about 1/10 of the case of using above mentioned known chelating agents.

The complexing agent of the present invention can be used alone or as a mixture of two or more thereof. The content of the complexing agent of the present invention in the first and second treating solutions is preferably in the range of $10^{-7}$ to $10^{-3}\%$ by weight, more preferably in the range of $10^{-6}$ to $10^{-4}\%$ by weight. When the content is over $10^{-3}\%$ by weight, there is a tendency to cause harmful contamination with carbon on the surface. On the other hand, when the content is below $10^{-7}\%$ by weight, the cleaning efficiency is lowered.

The (first) semiconductor surface treating solution of the present invention contains as major components an inorganic or organic alkali, hydrogen peroxide and water.

As the inorganic alkali, there can be used ammonia, preferably in the form of 20 to 30% by weight aqueous solution.

As the organic alkali, there can be used quaternary ammonium hydroxides, preferably in the form of 0.5 to 10% by weight aqueous solution. Examples of the quaternary ammonium hydroxides are trimethyl-2-hydroxyethylammonium hydroxide, tetramethylammonium hydroxide (TMAH), etc. It is also possible to use guanidine carbonate in the same concentration as mentioned above.

The inorganic or organic alkali is used in an amount of preferably 0.01 to 30% by weight, more preferably 0.01 to 20% by weight, based on the total weight of the first surface treating solution.

Hydrogen peroxide is preferably used in the form of 20 to 40% by weight aqueous solution. Hydrogen peroxide is used in an amount of preferably 0.01 to 30% by weight based on the total weight of the first surface treating solution. The cleaning efficiency is not particularly influenced even if the concentration of hydrogen peroxide is outside of the above-mentioned range.

The complexing agent of the present invention can be added to any one of the inorganic or organic alkali, hydrogen peroxide and water, or to any two components among the three components, or to all the three components, to prepare the desired first surface treating solution. The complexing agent can be added after the solution has been prepared by mixing.

When the complexing agent of the present invention is added to water for rinsing (a second treating solution, usually ultra-pure water being used), the same improved effects can be obtained.

Heretofore, the complexing agent used in the present invention was used as a stabilizing agent for hydrogen peroxide (Japanese Patent Examined Publication Nos. 43-11656, 55-45484 (U.S. Pat. No. 4,059,678), 59-45601 (U.S. Pat. No. 4,304,762,), 60-239305 (U.S. Pat. No. 4,534,945), 62-57566 (U.S. Pat. No. 4,362,706), 62-57567 (European Patent No. 97,305), etc.). But, there is no example of using such a compound for the same purpose as the present invention. Thus, the addition of such a compound to hydrogen peroxide solution for the purpose of the present invention has not been known. Thus, the use of hydrogen peroxide solution containing the complexing agent for preparing the first semiconductor surface treating solution is novel. Even if hydrogen peroxide solution stabilized with such a compound is used as a raw material of semiconductor grade high-purity one for SC-1 treatment, since said aqueous hydrogen peroxide solution is used after being purified by distillation, followed by purification by ion exchange, the stabilizer contained therein is removed completely before the use.

In the present invention, when the complexing agent of the present invention is added to a hydrogen peroxide solution, it is preferable to use the hydrogen peroxide solution after purification by distillation and removal of metallic impurities. But even if the hydrogen peroxide solution not purified is used, sufficient effects as to Fe, Al, Zn, etc. can be admitted. This has not been admitted before, and the present inventors have found this for the first time.

In one preferable embodiment of the present invention, there is provided a combination of surface treating solutions comprising a first surface treating solution comprising an inorganic or organic alkali, hydrogen peroxide and water as major components, and a second surface treating solution of ultra-pure water for rinsing, at least one of the first and second surface treating solutions containing as a complexing agent a compound having one or more phosphonic acid groups or a salt thereof in the molecule and showing chelating ability or an oxidized form thereof, or a polyphosphoric acid or a salt thereof.

Cleaning or treatment of surfaces of semiconductors can be carried out by a step of treating surfaces of semiconductors with a (first) surface treating solution comprising an inorganic or organic alkali, hydrogen peroxide and water as major components, and a step of treating or rinsing the resulting surfaces with ultra-pure water, at least one of the surface treating solution and the ultra-pure water containing as a complexing agent a compound having one or more phosphonic acid groups or a salt thereof in the molecule and showing chelating ability or an oxidized form thereof, or a polyphosphoric acid or a salt thereof.

The semiconductor surface treating solutions of the present invention show excellent inhibiting effects against adsorption and high cleaning efficiency of metal ions even at room temperature, so that heating treatment is not necessary at all. Needless to say, the effects of the present invention are not changed even if heated.

The semiconductor surface treating solution of the present invention may further contain one or more various auxiliaries such as surfactants, etc. so long as the effects of the present invention are not damaged.

The present invention is illustrated by way of the following Examples.

In the following Examples, the concentration of a metal ion on the surface of a wafer was measured by dissolving the metal ion into a small amount of ultra-pure dilute hydrofluoric acid sandwiched between a cleaned sheet of polytetrafluoroethylene and a wafer surface, followed by determination by graphite furnace atomic-absorption spectroscopy.

In the following Examples, there were used 28% ammonia water and 35% hydrogen peroxide solution, unless otherwise specified, and all the percents, ppm and ppb are by weight.

In addition, all the chemicals used in the Examples were ultra-pure products containing Fe in an amount of 0.1 ppb or less and Al in an amount of 0.1 ppb or less, admitted by graphite furnace atomic-absorption spectroscopy.

The water used was ultra-pure water containing Fe in an amount of 0.01 ppb or less and Al in an amount of 0.01 ppb, admitted by graphite furnace atomic-absorption spectroscopy.

EXAMPLE 1

To a mixed solution of 1 part by volume of ammonia water, 1 part by volume of hydrogen peroxide solution and 5 parts by volume of water (hereinafter referred to as "SC-1 cleaning solution"), ethylidene diphosphonic acid (EDP) was added in an amount of $10^{-4}$% or $1.5 \times 10^5$% to prepare a series of treating solutions. Then, Fe was added to the treating solutions in amounts of 10 ppb, 1 ppb and 0.1 ppb, respectively. In each treating solution, a 5 inch wafer of p-type with several $\Omega$cm and crystal orientation (100) was immersed and treated at 70° C. for 10 minutes, followed by rinsing with ultra-pure water for 10 minutes (hereinafter, the treating conditions for the wafer and with SC-1 cleaning solutions are the same). Then, the concentration of Fe adsorbed on the wafer surface was determined.

Figure 1:
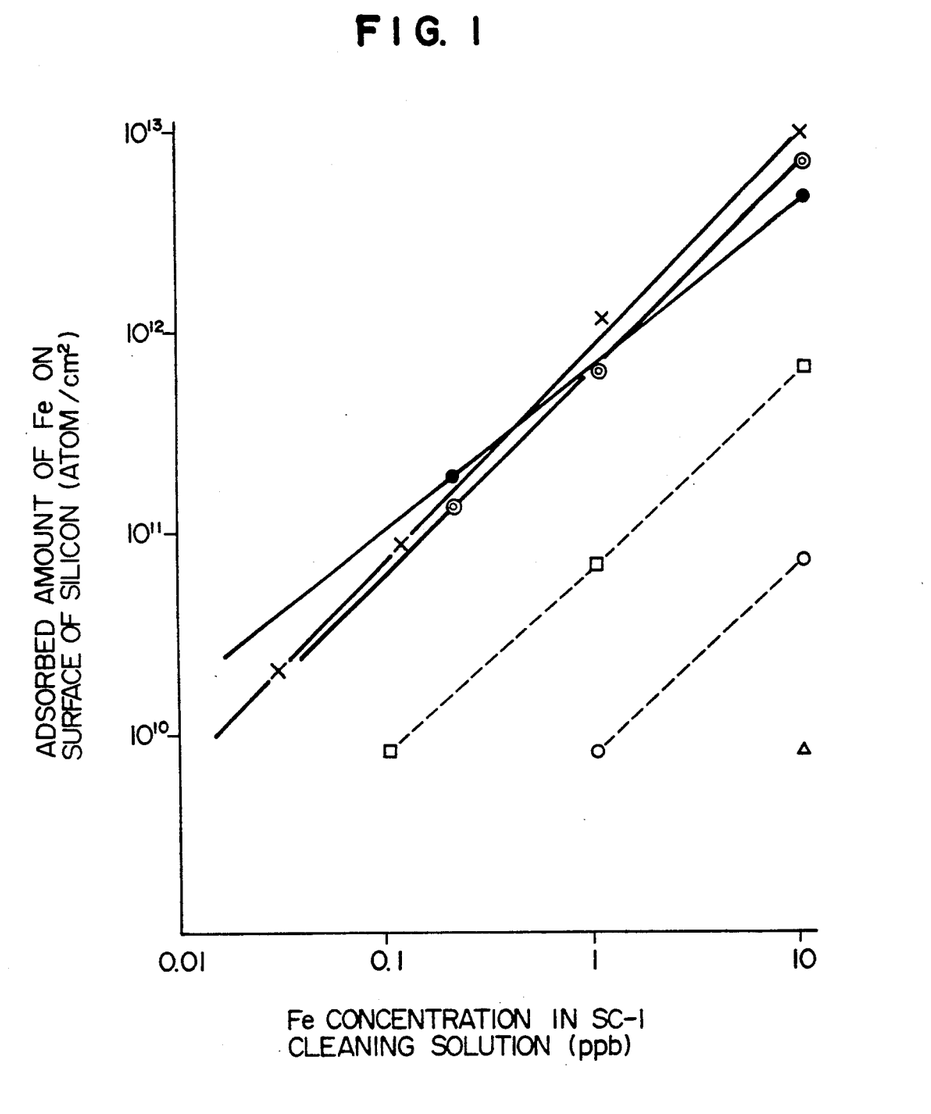
FIG. 1 is a graph showing a relationship between the Fe concentration in SC-1 cleaning solution (ppb) and the adsorbed amount of Fe (atom/$cm^2$) on a surface of silicon wafer obtained in Example 1 and Comparative Example 1.

The results are shown in FIG. 1, wherein Freundlich plots are shown by dotted lines.

--- o --- o --- : EDP $10^{-4}$% added.

--- □ --- □ --- : EDP $1.5 \times 10^{-5}$% added

Further, a relationship as to the adsorption from a solution containing 10 ppb of Fe in the case of adding EDP in an amount of $10^{-3}$% to a treating solution was shown by Δ in FIG. 1.

COMPARATIVE EXAMPLE 1

Three SC-1 cleaning solutions were prepared by using the same aqueous hydrogen peroxide solution from Vender A as used in Example 1 (no addition of EDP), and two commercially available hydrogen peroxide solutions from Vender B and C (no addition of complexing agent). Adsorption of Fe from the SC-1 cleaning solutions was measured in the same manner as described in Example 1.

The results are shown by Freundlich plots in FIG. 1 in solid lines.

x—x : Vender A
⊙—⊙: Vender B
●—●: Vender C

As shown in FIG. 1, there are almost no differences in hydrogen peroxide solutions used. When the concentration of Fe in the SC-1 cleaning solutions is 1 ppb, the adsorbed amount of Fe on the silicon wafer surface is about $10^{12}$ atoms/cm$^2$. In order to make the adsorbed amount of Fe $10^{10}$ atoms/cm$^2$ or less, it is necessary to make the Fe concentration in the SC-1 cleaning solutions 0.01 ppb or less.

As shown in FIG. 1, the surface treating solutions of Example 1 show remarkable effects for preventing adsorption compared with those of Comparative Example 1. That is, the control of Fe adsorption at $10^{10}$ atoms/cm$^2$ or less can be attained by adding $1.5 \times 10^{-5}\%$ of EDP to the Fe concentration level of 0.1 ppb in the SC-1 cleaning solutions, $10^{-4}\%$ of EDP to the Fe concentration level of 1 ppb, and $10^{-3}\%$ of EDP to the Fe concentration level of 10 ppb. Since the amount of complexing agent added is too small, the contamination with carbon can be neglected.

COMPARATIVE EXAMPLE 2

Adsorption of Al was tested in the same manner as described in Comparative Example 1. The Freundlich plots were almost the same as those of Fe shown in FIG. 1.

EXAMPLE 2

Adsorption of Al was tested in the same manner as described in Example 1 by adding $10^{-3}\%$ of EDP to the SC-1 cleaning solution. The adsorbed amount of Al was reduced by taking a figure down one place compared with the case of no addition of EDP (Comparative Example 2) in the Freundlich plots.

This means that the adsorption reducing effect for Al can be admitted, but weaker than the case of Fe. Thus, when the complexing agent of the present invention is used, it is better to conduct the purification of hydrogen peroxide sufficiently before the addition of the complexing agent so as to control the Al contamination caused by the chemical as small as possible.

EXAMPLE 3

Relationships between the concentration of complexing agent in the SC-1 cleaning solution containing 1 ppb of Fe and the adsorbed amount of Fe on the silicon wafer surface were tested by adding diethylenetriaminepenta(methylene phosphonic acid) (ETPPO), or triethanolamine (comparison) and EDTA (comparison) to the SC-1 cleaning solution used in Example 1.

Figure 2:
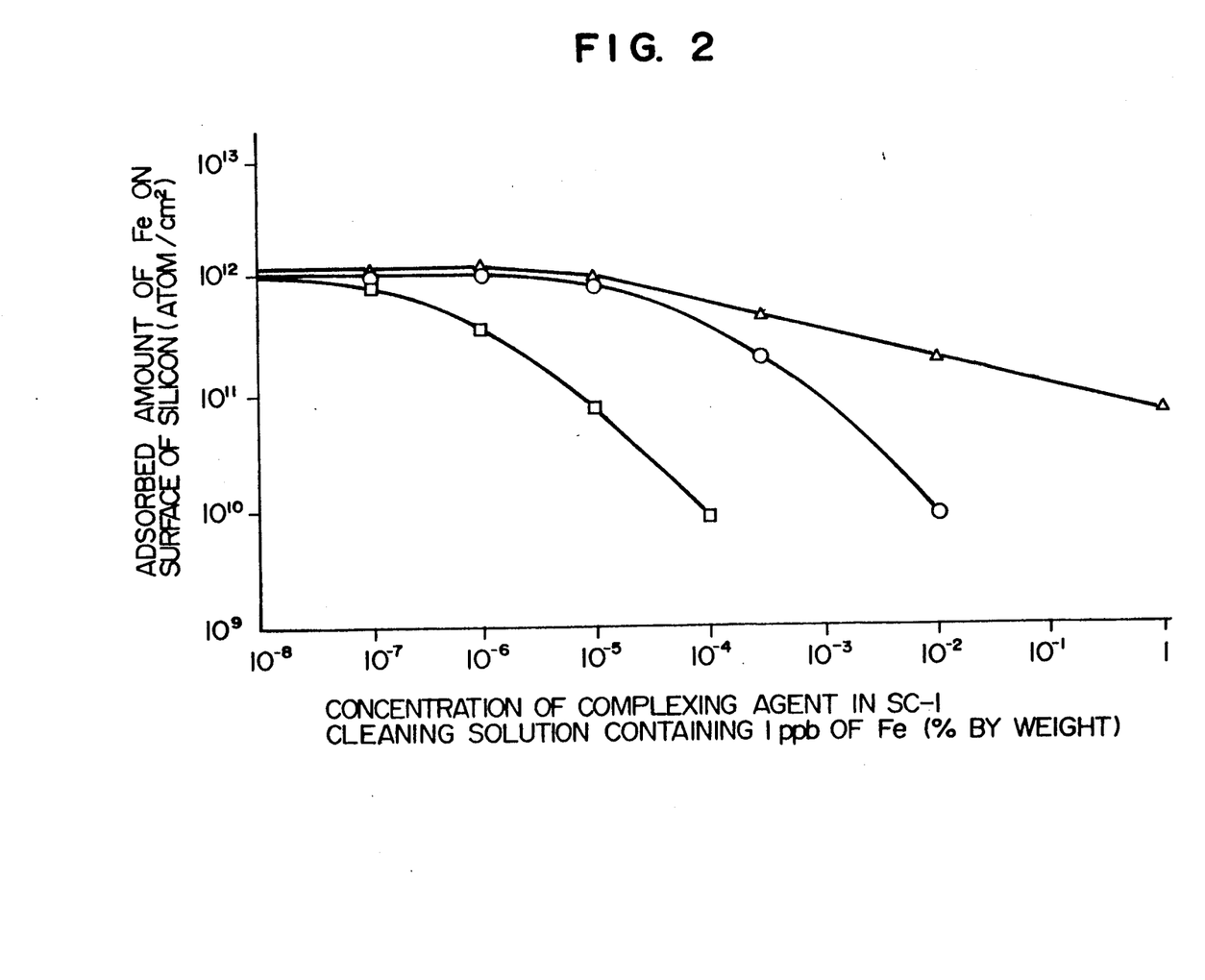
FIG. 2 is a graph showing a relationship between the concentration of complexing agent (% by weight) in SC-1 cleaning solution containing 1 ppb of Fe and the adsorbed amount of Fe (atom/$cm^2$) on a surface of a silicon wafer.

The results are shown in FIG. 2, wherein individual marks have the following meanings:
- □—□- : addition of ETPPO
- △—△- : addition of triethanolamine
-○—○- : addition of EDTA As shown in FIG. 2, in the present invention, the effect can be admitted by the addition of $10^{-7}\%$ of ETPPO and the Fe adsorbed amount of $10^{10}$ atoms/cm$^2$ or less can be obtained by the addition of $10^{-4}\%$ of ETPPO.

In contrast, the Fe adsorbed amount of $10^{11}$ atoms/cm$^2$ can only be attained by addition of 1% of triethanolamine, and the Fe adsorbed amount of $10^{11}$ atoms/cm$^2$ can only be attained by addition of $10^{-2}\%$ of EDTA.

COMPARATIVE EXAMPLE 3

To the SC-1 cleaning solution containing 1 ppb of Fe, $3 \times 10^{-4}\%$ of various complexing agents as shown in Table 1 were added and the Fe adsorbed amount on silicon wafer surface was measured. The results are shown in Table 1.

TABLE 1

| Complexing agent | Concentration of complexing agent (%) | Adsorbed amount of Fe (atoms/cm$^2$) |
|---|---|---|
| Triethanolamine | $3 \times 10^{-4}$ | $7 \times 10^{11}$ |
| Citric acid | $3 \times 10^{-4}$ | $7 \times 10^{11}$ |
| Tartaric acid | $3 \times 10^{-4}$ | $5 \times 10^{11}$ |
| Acetylacetone | $3 \times 10^{-4}$ | $6 \times 10^{11}$ |
| EDTA | $3 \times 10^{-4}$ | $2 \times 10^{11}$ |
| NTA*[1] | $3 \times 10^{-4}$ | $5 \times 10^{11}$ |
| No addition | — | $1.1 \times 10^{12}$ |

Note)
*[1]nitrylotriacetic acid

EXAMPLE 4

A SC-1 cleaning solution was prepared in the same manner as described in Example 1 except for using ammonia water (28%) to which $10^{-4}\%$ of methyl diphosphonic acid (MDP) was added previously. The concentration in the final SC-1 treating solution was $1.5 \times 10^{-5}\%$ of MDP. To this treating solution, 1 ppb of Fe was added and the adsorbed amount of Fe on the water surface after cleaning was measured. The adsorbed amount of Fe was $6 \times 10^{10}$ atoms/cm$^2$.

Using the treating solution to which no Fe was added, a silicon wafer, the surface of which was contaminated previously with $10^{12}$ atoms/cm$^2$ of Fe, was cleaned at 70° C. for 10 minutes, followed by rinsing with ultra-pure water for 10 minutes (hereinafter the same Fe contaminated wafer and the same cleaning conditions were used for the similar SC-1 cleaning experiment). The remaining amount of Fe on wafer surface was $6 \times 10^9$ atoms/cm$^2$, which results in making the remaining rate 0.6%. This means that the cleaning effect for Fe by the SC-1 treating solution is improved by the order of 10 times.

COMPARATIVE EXAMPLE 4

The same adsorption experiment and the same cleaning experiment as in Example 4 were repeated except for using various complexing agents similar to EDTA and having larger stability constants as listed in Table 2 in place of MDP.

The results are shown in Table 2.

TABLE 2

| Complexing agent ($10^{-4}\%$ based on ammonia water) | Adsorbed amount from SC-1 solution containing 1 ppb of Fe (atoms/cm$^2$) | Fe remaining rate after cleaning with SC-1 solution (%) |
|---|---|---|
| EDTA | $9 \times 10^{11}$ | 4.5 |
| CyDTA | $9 \times 10^{11}$ | 6.0 |
| TTHA | $1.1 \times 10^{12}$ | 4.5 |
| MDP (Example 4) | $6 \times 10^{10}$ | 0.6 |
| No addition | $1.4 \times 10^{12}$ | 8.0 |

As shown in Table 2, the complexing agents similar to EDTA have no substantial effects for preventing Fe adsorption and improving cleaning ability against Fe.

EXAMPLE 5

Surface treating solutions were prepared by adding $10^{-4}\%$ of a complexing agent as listed in Table 3, that is, hexametaphosphoric acid (HP), 1-hydroxyethylidene-1,1-diphosphonic acid (HDP), nitrylotris(methylene phosphonic acid) (NTPO), ethylenediaminetetrakis(methylene phosphonic acid) (EDTPO) or ETPPO, to the same SC-1 cleaning solution as used in Example 1.

Using each treating solution, a silicon wafer contaminated previously with 10 atoms/cm$^2$ of Fe was cleaned and Fe remaining amount was measured to give a Fe remaining rate. Further, a silicon wafer contaminated with $5 \times 10^{12}$ atoms/cm$^2$ of Al was also cleaned and Al remaining rate was obtained in the same manner as mentioned above. The same test was also conducted using a silicon wafer contaminated with $10^{12}$ atoms/cm$^2$ of Zn.

The results are shown in Table 3.

COMPARATIVE EXAMPLE 5

The same tests as mentioned in Example 5 were repeated except for using as the chelating agent EDTA or acetylacetone in an amount of $10^{-4}\%$ in place of the complexing agent used in Example 5 and for no addition of chelate compound.

The results are shown in Table 3.

TABLE 3

| Example No. | Complexing Complexing or chelating agent | Remaining rate after cleaning (%) | | |
|---|---|---|---|---|
| | | Fe | Al | Zn |
| Example 5 | HP | 0.6 | 18 | 0.6 |
| | HDP | 0.7 | 22 | 0.5 |
| | NTPO | 0.5 | 19 | 0.4 |
| | EDTPO | 0.5 | 20 | 0.6 |
| | ETPPO | 0.6 | 18 | 0.7 |
| Comparative Example 5 | No addition | 8.0 | 42 | 6.0 |
| | EDTA | 4.0 | 40 | 4.1 |
| | Acetyl-acetone | 6.7 | 40 | 5.1 |

As is clear from Table 3, the semiconductor surface treating solutions of the present invention show remarkable improvement in cleaning effects against Fe and Zn by addition of the special complexing agents in amounts as small as $10^{-4}\%$, and also show considerable improvement against Al.

In contrast, the addition of EDTA and acetylacetone as the chelating agent, which are also able to form cyclic chelates, did not show excellent effects as in the present invention, though they are the most common and representative chelating agents.

EXAMPLE 6

A semiconductor surface treating solution containing $10^{-4}\%$ of EDP was prepared in the same manner as described in Example 1 except for using an aqueous solution of 1% trimethyl(2-hydroxyethyl)ammonium hydroxide in place of 28% ammonia water.

The adsorption of Fe on a silicon wafer surface from the treating solution was tested in the same manner as described in Example 1 (70° C., 10 minutes). As a result, almost the same Freundlich plots as dotted lines in FIG. 1 were obtained.

EXAMPLE 7

A semiconductor surface treating solution containing $10^{-4}\%$ of EDP was prepared in the same manner as described in Example 1 except for using aqueous 1% TMAH solution in place of 28% ammonia water.

The adsorption of Fe on a silicon wafer surface from the treating solution was tested in the same manner as described in Example 6. As a result, almost the same Freundlich plots as dotted lines in FIG. 1 were obtained.

As is clear from the results of Examples 6 and 7, in a alkali-peroxide treating solution the complexing agent of the present invention can provide strong inhibiting effect on Fe adsorption on a silicon surface irrespective of the use of inorganic or organic alkali.

EXAMPLE 8

Semiconductor surface treating solutions were prepared in the same manner as described in Example 6 except for using $10^{-4}\%$ of HDP or ETPPO in place of EDP.

A silicon wafer contaminated with $10^{12}$ atoms/cm$^2$ of Fe was cleaned with each treating solution at 70° C. for minutes, followed by rinsing with pure water. Then, the remaining rate of Fe was obtained.

Further, 1 ppb of Fe was added to each treating solution. Using the resulting contaminated treating solution, a pure silicon wafer was treated as mentioned above. The adsorbed amount of Fe on the silicon wafer surface was also measured.

The results are shown in Table 4.

TABLE 4

| Complexing agent ($10^{-4}\%$ of treating solution) | Adsorbed amount of Fe from treating solution containing 1 ppb of Fe (atoms/cm$^2$) | Remaining rate of Fe after cleaning (%) |
|---|---|---|
| HDP | <$10^{10}$ | 0.7 |
| ETPPO | <$10^{10}$ | 0.6 |

As is clear from the above-mentioned results, the effects of the chelating agent of the present invention do not change whether inorganic or organic alkali is used.

EXAMPLE 9

Semiconductor surface treating solutions were prepared by the following three methods A, B and C using ammonia water, 35% hydrogen peroxide solution and water in proportions of 1 part by volume, 1 part by volume and 5 parts by volume, respectively.

Method A:
After dissolving $7 \times 10^{-4}\%$ of EDP in 28% ammonia water, hydrogen peroxide solution and water were mixed.

Method B:
After dissolving $7 \times 10^{-4}\%$ of EDP in hydrogen peroxide solution, 28% ammonia water and water were mixed.

Method C:
After dissolving $1.4 \times 10^{-4}\%$ of EDP in water, ammonia water and hydrogen peroxide solution were mixed.

After adding 1 ppb of Fe to the thus prepared treating solutions which contain $10^{-4}\%$ of EDP, silicon wafers were cleaned and rinsed in the same manner as described in Example 1. The adsorbed amount of Fe on each surface of silicon wafer was measured and shown in Table 5.

TABLE 5

| Method | Concentration of EDP in the treating solution | Adsorbed amount of Fe (atoms/cm$^2$) |
|---|---|---|
| A | $10^{-4}\%$ | $<10^{10}$ |
| B | $10^{-4}\%$ | $<10^{10}$ |
| C | $10^{-4}\%$ | $<10^{10}$ |

As is clear from Table 5, the complex formation ability appears in the same manner and each treating solution has the same effectiveness for prevention of Fe adsorption and then cleaning against Fe even if the complexing agent of the present invention is added first to any of the ammonia water, hydrogen peroxide solution or water. Further, as shown in Examples 1 to 5, the complexing agent of the present invention can also be added to a mixture of the ammonia water, hydrogen peroxide solution and water without lowering the effects.

EXAMPLE 10

Using a pure p-type (100) wafer adsorbing about $5\times10^9$ atoms/cm$^2$ of Fe by acid cleaning, cleaning treatment was conducted with a SC-1 treating solution contaminated with 1 ppb of Fe or SC-1 treating solution contaminated with 1 ppb of Fe but added with $10^{-4}\%$ of EDP at 70° C. for 10 minutes, followed by rinsing with ultra-pure water and drying. Each treated wafer was subjected to thermal oxidization and measurement of recombination lifetime by a photo decay method using microwave detection.

The results are shown in Table 6.

TABLE 6

| Electrical properties | Treating solution SC-1 | Treating solution SC-1 + EDP | Before treating (Comparison) |
|---|---|---|---|
| Recombination lifetime (μ sec) | 15 | 54 | 58 |

As is clear from Table 6, even if the SC-1 treating solution is contaminated with 1 ppb of Fe, when the chelating agent of the present invention is present therein even in trace amount, the recombination lifetime becomes the same level as a pure wafer of no treatment. It is well known that p-type silicon wafers are sensitively influenced in the lifetime by the contamination of Fe. As is clear from Example 1, the presence of the complexing agent of the present invention can inhibit the Fe contamination at $10^{10}$ atoms/cm$^2$ or less, which value does not lower the lifetime.

EXAMPLE 11

To ultra-pure water containing 0.01 ppb of Fe, 0.1 ppb of Fe was added, followed by pH adjustment with ammonia water to pH 8.5. A silicon wafer was dipped in the resulting water for 10 minutes to cause the Fe adsorption of $1.1\times10^{11}$ atoms/cm$^2$. To this water, $1.5\times10^{-6}\%$ of EDTPO was added and the pH was adjusted to 8.5 with ammonia water. When a silicon wafer was dipped in the resulting water, the adsorbed amount of Fe on the silicon wafer surface was less than $10^{10}$ atoms/cm$^2$.

EXAMPLE 12

EDTPO or NTPO was added to hydrogen peroxide solution to form N-oxide form (oxidized form) of EDTPO or NTPO. The resulting N-oxide form was added to a SC-1 treating solution containing 1 ppb of Fe so as to make the concentration of N-oxide form $3\times10^{-4}\%$ A silicon wafer was treated with the resulting treating solution in the same manner as described in Example 1 to measure the adsorbed amount of Fe.

On the other hand, hydrogen peroxide solution containing $2\times10^{-3}\%$ of N-oxide form (oxidized form) was stored at 20° C. for 30 days. Using the resulting hydrogen peroxide solution, a SC-1 treating solution containing 1 ppb of Fe was prepared. Using the resulting treating solution, a silicon wafer was treated in the same manner as described in Example 1.

The adsorbed amount of Fe was measured and listed in Table 7.

TABLE 7

| Complexing agent | Adsorbed amount of Fe from SC-1 solution containing 1 ppb of Fe atoms/cm$^2$) | |
|---|---|---|
| | Immediately after addition | After 30 days |
| EDTPO | $<10^{10}$ | — |
| EDTPO-oxidized form | $<10^{10}$ | $<10^{10}$ |
| NTPO | $<10^{10}$ | — |
| NTPO-oxidized form | $<10^{10}$ | $<10^{10}$ |

As is clear from Table 7, EDTPO-oxidized form and NTPO-oxidized form are also effective for preventing adsorption of Fe as EDTPO and NTPO. Such effects are not changed even if stored for 30 days, and very stable.

According to known cleaning treatment using "alkali+hydrogen peroxide", there are obtained excellent effects of removing fine particulates contamination and good effect of removing fats and oils contamination but the resulting wafers are not satisfactory in electrical properties.

In contrast, according to the present invention, by adding a trace amount of the special complexing agent to a cleaning solution, said trace amount meaning an amount not giving injurious organic contamination in the production process of semiconductors, the adsorption of harmful metallic impurities from the solution can be decreased to the impurity concentration on the surface which does not cause problems on electrical properties such as lowering of the recombination lifetime, deterioration of oxide breakdown characteristics, etc. Further, cleaning ability for the harmful impurities can also be improved.

In addition, the effects of the present invention are not limited to the solution comprising "alkali and hydrogen peroxide". It is known that the adhesive force of fine particulates to silicon wafers becomes weaker when the pH becomes higher. But, when pH is higher than 3, Fe in the presence of water shows a strong tendency to form a colloid so as to increase a danger of the contamination. Further, the Fe concentration of ultra-pure water used for rinsing happens to increase to about 0.1 ppb. According to the present invention, addition of the special complexing agent to rinsing water for alkali cleaning can prevent such Fe contamination by adsorption.

The treating solution and treating method of the present invention are effective not only for silicon single crystal surfaces but also polycrystal film surfaces. Thus, the present invention is also effective for cleaning glass substrates for LCD using such films. Further, the present invention is also applicable to compound semiconductors which dislike contamination with Fe, Zn, etc. The present invention can widely be applied to the production process of wafers and to the production process of devices. The surface treating solutions of the present invention are very useful industrially.

What is claimed is:

1. A process for treating semiconductor surfaces, which comprises a step of treating surfaces of semiconductors contaminated with metallic impurities including at least one of Fe, Al, Zn, Ca and Mg with a surface treating solution comprising an inorganic or organic alkali, hydrogen peroxide and water as major components, and a step of treating the resulting surface with ultra-pure water, at least one of the surface treating solution and the ultra-pure water containing as a complexing agent a compound having one or more phosphonic acid groups or a salt thereof and showing chelating ability or an oxidized form thereof, or a polyphosphoric acid or a salt thereof.

2. A process according to claim 1, wherein the complexing agent is contained in the surface treating solution and the concentration of Fe is reduced to $10^{10}$ atoms/cm$^2$ or less.

3. A process according to claim 1, wherein the complexing agent is contained in the ultra-pure water and the concentration of Fe is reduced to $10^{10}$ atoms/cm$^2$ or less.

4. A process according to claim 1, wherein the complexing agent is previously added to the inorganic or organic alkali.

5. A process according to claim 1, wherein the complexing agent is previously added to hydrogen peroxide.

6. A process according to claim 1, wherein the complexing agent is at least one member selected from the group consisting of methyl diphosphonic acid, aminotris(methylene phosphonic acid), ethylidene diphosphonic acid, 1-hydroxyethylidene-1,1-diphosphonic acid, 1-hydroxypropylidene-1,1,-diphosphonic acid, ethyl aminobis(methylene phosphonic acid), dodecyl aminobis(methylene phosphonic acid), nitrylotris(methylene phosphonic acid), ethylenediaminebis(methylene phosphonic acid), ethylenediamine-tetrakis(methylene phosphonic acid), hexenediamine-tetrakis(methylene phosphonic acid), diethylene-triaminepenta(methylene phosphonic acid), ammonium salts thereof, potassium salts thereof and lithium salts thereof.

7. A process according to claim 1, wherein the complexing agent is an N-oxide form obtained by oxidizing a compound having an N atom and one or more phosphonic acid groups or a salt thereof and showing chelating ability.

8. A process according to claim 1, wherein the complexing agent is contained in an amount of $10^{-7}$ to $10^{-3}$% by weight.

* * * * *